(12) United States Patent
Latypov et al.

(10) Patent No.: US 7,102,733 B2
(45) Date of Patent: Sep. 5, 2006

(54) SYSTEM AND METHOD TO COMPENSATE FOR STATIC AND DYNAMIC MISALIGNMENTS AND DEFORMATIONS IN A MASKLESS LITHOGRAPHY TOOL

(75) Inventors: Azat M. Latypov, Danbury, CT (US); Christopher J. Mason, Newtown, CT (US); Sherman K. Poultney, Wilton, CT (US); Arno J. Bleeker, Westerhoven (NL)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 10/917,380

(22) Filed: Aug. 13, 2004

(65) Prior Publication Data

US 2006/0033902 A1    Feb. 16, 2006

(51) Int. Cl.
G03B 27/54    (2006.01)
G03B 27/42    (2006.01)
(52) U.S. Cl. .......................................... 355/67; 355/53
(58) Field of Classification Search ................. 355/53, 355/55, 67–71; 430/5, 20; 359/290–292
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,691,541 A | 11/1997 | Ceglio et al. | |
| 5,808,797 A | 9/1998 | Bloom et al. | |
| 5,982,553 A | 11/1999 | Bloom et al. | |
| 6,122,397 A | 9/2000 | Lee et al. | |
| 6,133,986 A | 10/2000 | Johnson | |
| 6,177,980 B1 | 1/2001 | Johnson | |
| 6,251,550 B1 | 6/2001 | Ishikawa | |
| 6,312,134 B1 | 11/2001 | Jain et al. | |

(Continued)

FOREIGN PATENT DOCUMENTS

WO    WO 98/04950    2/1998

(Continued)

OTHER PUBLICATIONS

"Micronic Laser Pattern Generators—Pattern Accuracy at the Speed of Light," *Micronic Laser Systems*, dated Nov. 2002, 2 pages, downloaded on Dec. 26, 2003 from http://www.micronic.se/site_swe/litteratur/pdf/Sigma_Omega_product_sheet.pdf.

(Continued)

*Primary Examiner*—Henry Hung Nguyen
(74) *Attorney, Agent, or Firm*—Sterne, Kessler, Goldstein & Fox P.L.L.C.

(57) ABSTRACT

The present invention provides systems and methods for maskless lithographic printing that compensate for static and/or dynamic misalignments and deformations. In an embodiment, a misalignment of a pattern formed by a spatial light modulator is measuring during printing. Rasterizer input data is generated based on the measured misalignment and passed the rasterizer. The rasterizer generates pattern data, based on the rasterizer input data, that is adjusted to compensate for the measured misalignment. The pattern data generated by the rasterizer is passed to the spatial light modulator and used to form a second pattern, which includes compensation for the measured misalignment. In an embodiment, deformations caused, for example, by a warping a surface of the spatial light modulator are measured and used by the rasterizer to generate pattern data that compensates for the deformations.

29 Claims, 9 Drawing Sheets

U.S. PATENT DOCUMENTS

| | | |
|---|---|---|
| 6,544,698 B1 | 4/2003 | Fries |
| 6,628,372 B1 | 9/2003 | McCullough et al. |
| 6,687,041 B1 | 2/2004 | Sandstrom |
| 6,747,783 B1 | 6/2004 | Sandstrom |
| 6,795,169 B1 | 9/2004 | Tanaka et al. |
| 6,806,897 B1 | 10/2004 | Kataoka et al. |
| 6,811,953 B1 | 11/2004 | Hatada et al. |
| 2003/0077089 A1 | 4/2003 | Luellau |
| 2003/0160980 A1* | 8/2003 | Olsson et al. ............... 358/1.9 |
| 2003/0190535 A1 | 10/2003 | Fries |
| 2004/0041104 A1 | 3/2004 | Liebregts et al. |
| 2004/0130561 A1 | 7/2004 | Jain |
| 2005/0007572 A1 | 1/2005 | George et al. |
| 2005/0047543 A1* | 3/2005 | Sandstrom ................... 378/34 |
| 2005/0128450 A1* | 6/2005 | Schroeder ................... 355/53 |
| 2005/0219532 A1* | 10/2005 | Mason ....................... 356/401 |

FOREIGN PATENT DOCUMENTS

| | | |
|---|---|---|
| WO | WO 98/33096 | 7/1998 |
| WO | WO 98/38597 | 9/1998 |
| WO | WO 00/03307 | 1/2000 |

OTHER PUBLICATIONS

"A Little Light Magic," *IEEE Spectrum* (Sep. 2003), pp. 34-39.

* cited by examiner

SYSTEM AND METHOD TO COMPENSATE FOR STATIC AND DYNAMIC MISALIGNMENTS AND DEFORMATIONS IN A MASKLESS LITHOGRAPHY TOOL

FIELD OF THE INVENTION

The present invention relates to lithography, and in particular to maskless lithography.

BACKGROUND OF THE INVENTION

Lithography systems and tools are used to print features in a variety of manufacturing applications. Photolithography systems use a mask or reticle to expose features onto an object. In semiconductor manufacturing, for example, a reticle is exposed by an exposure beam. An optical system then projects a reduced image of the reticle onto a silicon wafer. In this way, circuit features can be printed on a semiconductor substrate.

Maskless lithography systems have been developed, which do not require use of a mask or reticle. Current maskless lithography mask writing systems project a pattern to be printed onto a moving object. For example, a pattern of circuit features can be projected onto a moving wafer. In one example, a silicon wafer can be coated with a photoresist. The pattern is projected in a sequence of exposures (also called shots). Each shot projects an image of a pattern from one or more spatial light modulator (SLM) arrays.

An SLM array is a programmable array of elements that modulates the light projected onto the object. One type of SLM is a digital micromirror device (DMD). A DMD is often used in a reflective mode. Each mirror within the DMD can be programmed to reflect light such that it passes in or out of an optical path. A DMD then acts as a binary switch that outputs light in one of two binary states: "on" or "off." Shading or grayscale variation of the light intensity can be achieved by changing the duty cycle of a laser pulse source so as to increase or decrease the exposure time. In this way, the DMD can be programmed to project a desired pattern onto an object such as a wafer by controlling the individual micromirror elements to reflect in a desired pattern.

Another type of SLM is a transmissive liquid crystal light valve (LCLV). An LCLV is typically arranged in a transmissive configuration. Like the DMD, the LCLV is programmed such that the individual light valves are controlled to project a desired pattern onto an object. Typically, polarized light is passed through the LCLV. The individual valves are controlled such that a polarization state is rotated, thereby modulating the intensity of the polarized light that passes through the respective valve. The polarization of an individual light crystal valve can be controlled to pass light in a binary fashion (on/off) or at different intensity levels with shading or grayscale variation by adjusting the rotation of polarization.

Maskless lithographic tools and techniques are increasingly called upon to print patterns at high resolution. For example, in the manufacture of semiconductor dies or chips, patterns of circuit features, such as lines for passive or active devices, often need to be printed at a high resolution to improve the packing density of circuit elements and reduce the pitch of the pattern. At high resolution, the alignment of the SLM arrays relative to the wafer becomes even more important. In order to obtain a desired distribution of a dose in the resist with high accuracy, SLM arrays need to be aligned with respect to each other and with respect to the object being printed.

Alignment needs to be precise. Each SLM array used to dynamically generate a pattern in maskless lithography needs to be properly aligned to other SLM arrays and to an absolute coordinate system such as a general frame of reference in an object plane. This alignment needs to be performed to a small fraction of the size of a single pixel in directions parallel to the object plane and to a small fraction of a wavelength in a direction normal to the object plane.

Two types of misalignment can occur: static and dynamic. A static misalignment or a static deformation refers to a residual misalignment or deformation of an SLM array compared to a desired, aligned position. A static misalignment or deformation generally does not change during a scan or shot. A dynamic misalignment or deformation refers to a time-varying displacement or deformation. Dynamic misalignment and/or deformation can occur during printing when heat and vibrations produced by the operation of each SLM array and supporting electronics can cause SLM arrays to dynamically displace as a rigid body and deform (i.e., warp). Both static and dynamic misalignments and deformations (if left uncompensated) degrade the accuracy of the printed pattern. Deformations and misalignments in the directions parallel to the object plane introduce spatial distortions in the image. Deformations and misalignments in the direction normal to the object plane result in defocus and/or telecentricity effects.

What is needed is a system and method for compensating each SLM array's static and dynamic spatial misalignment and deformation.

SUMMARY OF THE INVENTION

The present invention provides a system and method to compensate for static and dynamic misalignments and deformations in a maskless lithography tool. In a system embodiment, the system includes a spatial light modulator, a substrate stage, at least one optical element, a rasterizer, and a sensor. The spatial light modulator is used to forms patterns, for example, for wafer printing or flat panel display printing. The spatial light modulator typically includes a plurality of spatial light modulator arrays. The substrate stage holds the media to be exposed (e.g., a wafer or substrate). At least one optical element images the patterns formed by the spatial light modulator onto, for example, the wafer or substrate held by the substrate stage. The rasterizer is coupled to the spatial light modulator and generates the pattern data used by the spatial light modulator to form the patterns. The sensor, coupled to the rasterizer, provides a signal to the rasterizer related to misalignment and/or deformation of the spatial light modulator arrays. The rasterizer uses the signal from the sensor in generating the pattern data to compensates for misalignment and/or deformation of the spatial light modulator arrays.

In embodiments, the sensor is a positional sensor. The sensor provides a signal to the rasterizer related to a displacement of the patterns relative to a predetermined frame of reference. The displacement can be within a plane of the frame of reference and/or normal to the plane of the frame of reference. In one embodiment, the sensor provides a signal to the rasterizer related to a tilting of the patterns relative to a predetermined frame of reference. In another embodiment, the sensor provides a signal to the rasterizer related to a rotation of the patterns relative to a predetermined frame of reference. In still another embodiment, the sensor provides a signal to the rasterizer related to aerial images of the patterns and/or field-varying defocus of the patterns.

In one embodiment, the sensor provides a signal to the rasterizer related to a warping of a surface of the spatial light modulator or spatial light monitor arrays.

In an embodiment, the rasterizer calculates the pattern data during printing or exposure of a wafer or substrate. In another embodiment, the rasterizer retrieves pre-computed pattern data from a memory during printing or exposure of a wafer or substrate.

In a method embodiment of the present invention, a misalignment of a pattern formed by the spatial light modulator is measuring during printing. Rasterizer input data is generated based on the measured misalignment. The rasterizer input data is passed the rasterizer. The rasterizer generates pattern data that is adjusted based on the rasterizer input data passed to the rasterizer. This pattern data is passed to the spatial light modulator and used to form a second pattern that compensates for the measured misalignment. In a method embodiment, a warping of a surface of the spatial light modulator is measured and used by the rasterizer to generate pattern data that compensates for the measured warping.

It is a feature of the present invention that it can compensate for static and/or dynamic misalignments and deformations.

It is also a feature of the present invention that it can compensate for misalignments of the projected images caused by mechanical misalignments or the misalignments and image imperfections caused by optical aberrations and distortions. Additionally, the present invention can compensate for pattern-to-pattern misalignments or layer-to-layer misalignments due, for example, to skews and/or rotations between layers so that each layer has improved matching.

Further embodiments, features, and advantages of the present invention, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION OF THE INVENTION

The present invention provides systems and methods for improved maskless lithographic printing that compensate for static and dynamic position misalignments and deformations. While specific configurations and arrangements are discussed, it should be understood that this is done for illustrative purposes only. Persons skilled in the art(s) will recognize that other configurations and arrangements can be used without departing from the spirit and scope of the present invention. It will be apparent to persons skilled in the pertinent art(s) that this invention can be employed in a variety of other applications.

Figure 1:
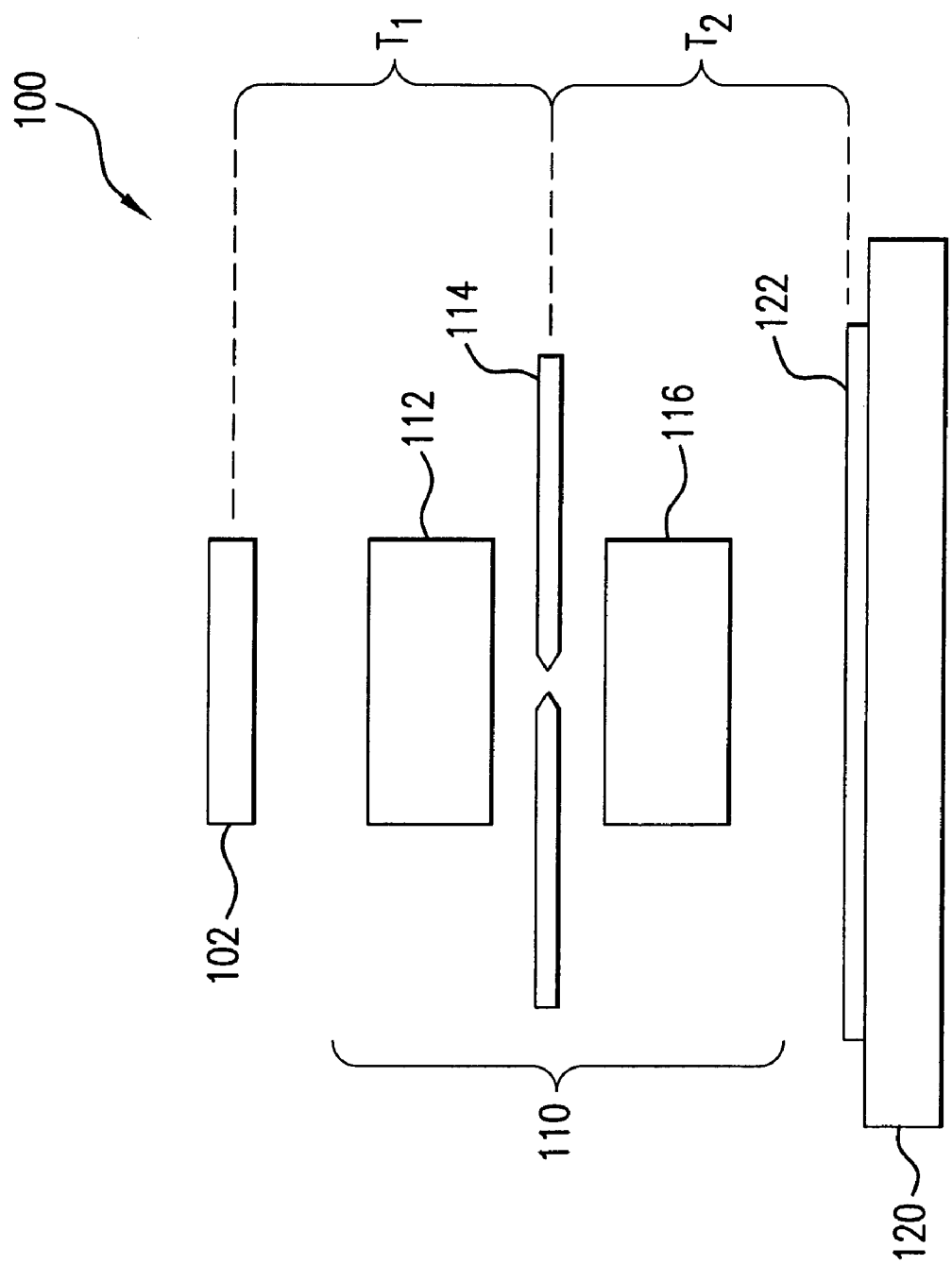
FIG. 1 is a schematic illustration of a maskless lithography system.

FIG. 1 is a schematic illustration of a maskless lithography system 100 in which the present invention is used. System 100 includes a spatial light modulator 102, projection optics 110, and a substrate stage 120. Projection optics 110 typically include optical elements 112, an aperture 114, and optical elements 116. An object 122 (e.g., wafer of substrate) to be exposed to one or more patterns (not shown) formed by spatial light modulator 102 is held and moved during exposure by substrate stage 120. As used herein, the term pattern refers to any pattern printed onto a substrate. For example, as used herein, a pattern can be a pattern used to make integrated circuits, flat panel displays, or other products in which a pattern is printed onto a wafer or substrate.

Figure 2A:
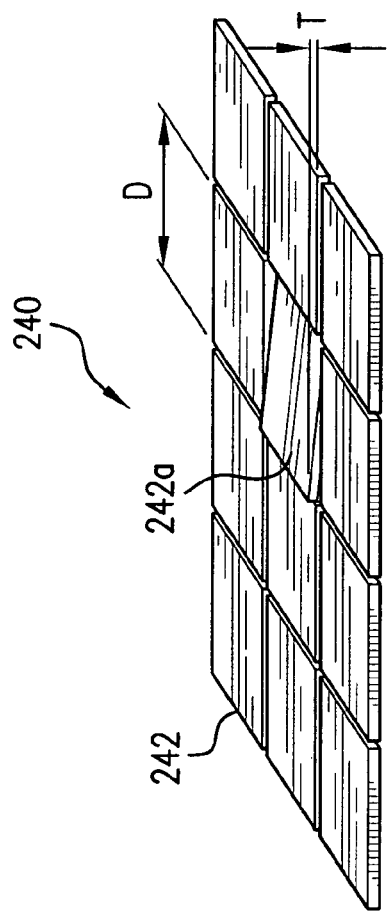
FIG. 2A is a schematic illustration of a portion of a spatial light modulator according to an embodiment of the present invention.

FIG. 2A is a schematic illustration of a spatial light modulator array 240 of spatial light modulator 102 according to an embodiment of the present invention. Of course, other spatial light modulators or contrast devices can be employed without deviating from the scope of the present invention. Spatial light modulator array 240 is a tilting mirror spatial light modulator array. As shown in FIG. 2A, spatial light modulator array 240 comprising twelve mirrors 242. Each mirror 242 has a side length of D. In one embodiment, the length D is approximately 16 micrometers. In another embodiment, the length D is approximately 8 micrometers. A pixel represented by a mirror 242 can be turned off, for example, by tilting the mirror a distance T as represented by mirror 242a. This distance is equal to a quarter of a wavelength of the incident light. For instance, in a preferred embodiment, the distance T is approximately 0.062 micrometers. In a typical embodiment, a tilting mirror spatial light modulator array 242 according to an embodiment of the present invention would have 1000 or more mirrors 242.

Figure 2B:
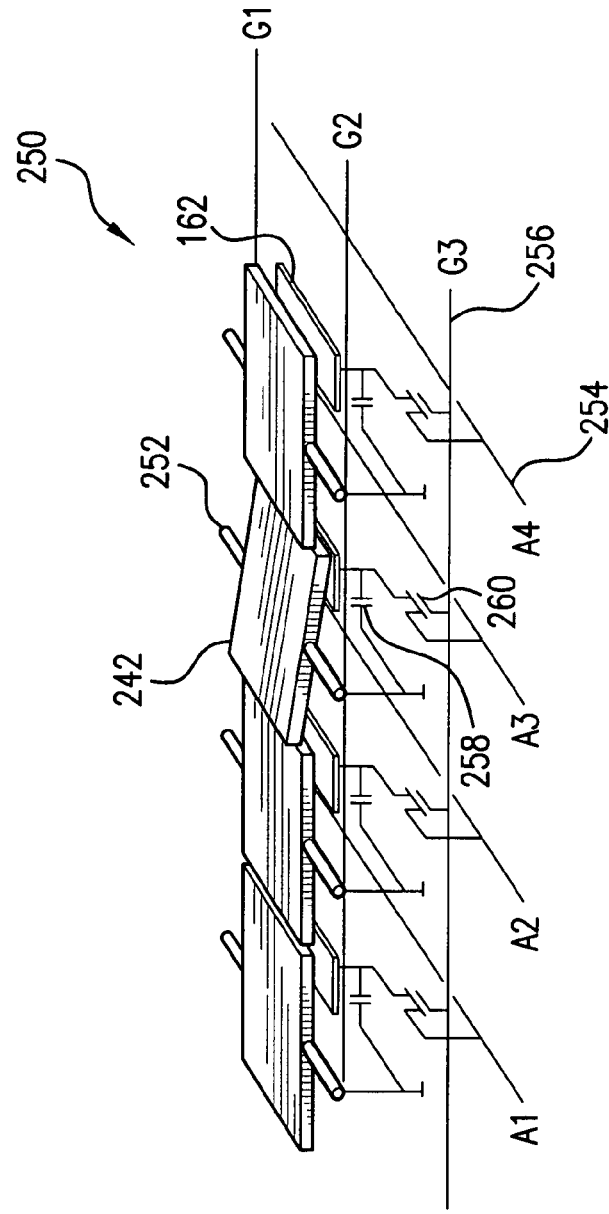
FIG. 2B is a schematic illustration of an addressing circuit for the spatial light modulator of FIG. 2A.

FIG. 2B is a schematic illustration of an addressing circuit 250 for the spatial light modulator array 240. The addressing circuit 250 is used to tilt each mirror 242 about an axis 252. Addressing circuit 250 comprises a plurality of addressing lines 254 and 256, capacitors 258, transistors 260, and tilting pads 262. As would be understood by persons skilled in the relevant art(s) given the description herein, by applying appropriate signals to the addressing lines 254 and 256, the tilting of each individual mirror 242 can be controlled.

Figure 3:
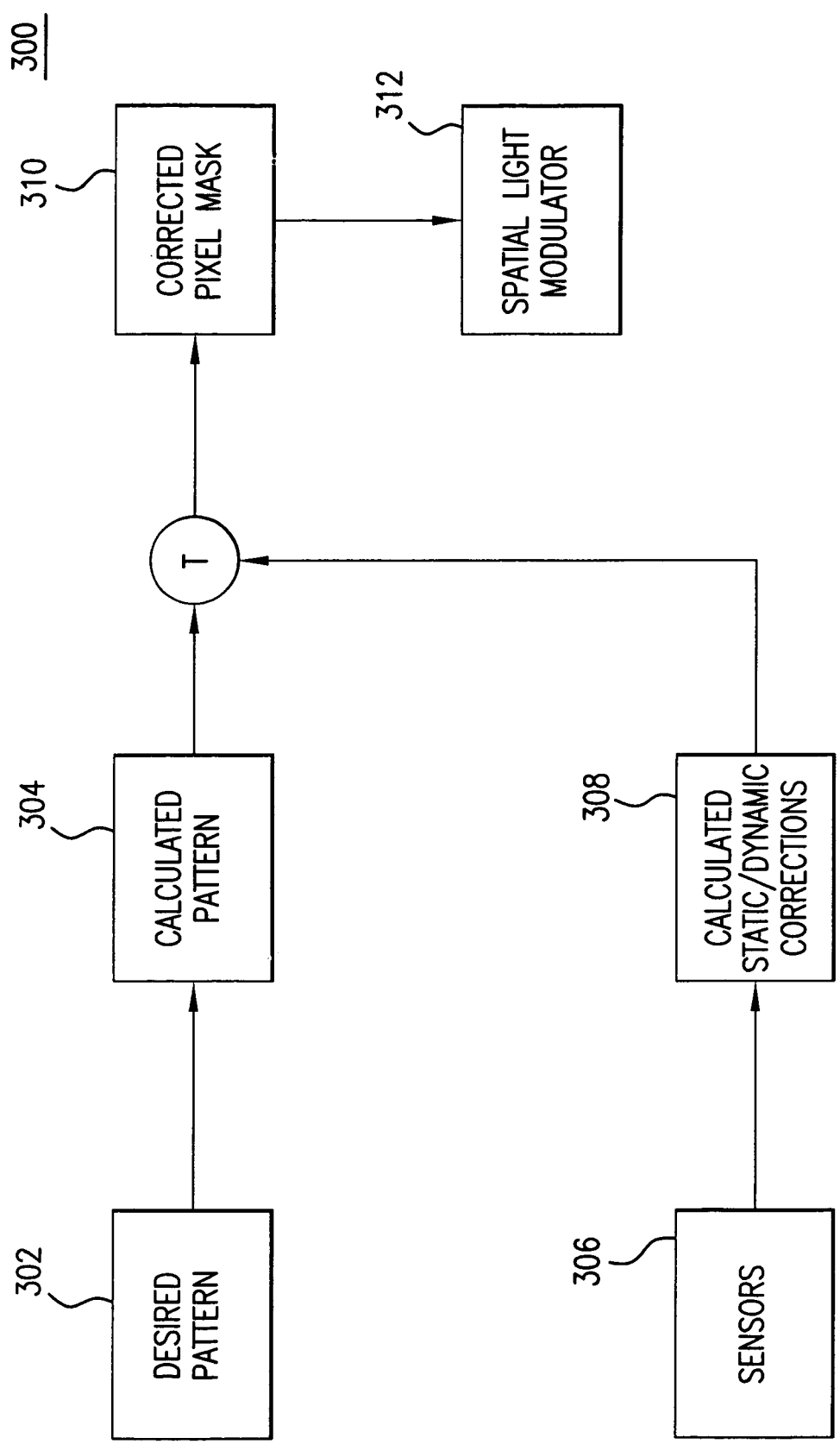
FIG. 3 is a schematic illustration of a system that compensates for static and/or dynamic misalignments and deformations in a maskless lithography tool according to an embodiment of the present invention.

FIG. 3 is a schematic illustration of a system 300 that compensates for static and/or dynamic misalignments and deformations in a maskless lithography tool according to an embodiment of the present invention. System 300 operates as follows. A desired pattern 302 is specified by the operator of the maskless lithography tool. A calculated pattern 304 is formed from desired pattern 302. Sensor(s) 306 measure one or more aspects of the maskless lithography tool, as described in more detail below, and form output(s) related to misalignments and deformations of the tool. The output(s) of sensor(s) 306 are used to form calculated static and/or dynamic corrections 308 needed to compensate for the misalignments and deformations. A rasterizer (not shown) combines calculated pattern 304 and the calculated static and/or dynamic corrections 308 to form a corrected pixel mask 310. Corrected pixel mask 310 is applied to a spatial light modulator 312. When corrected pixel mask 310 is applied to spatial light modulator 312, spatial light modulator 312 forms a pattern that includes compensation for misalignments and deformations of the tool detected using sensor(s) 306.

In embodiments of the present invention, pattern-to-pattern or layer-to-layer misalignments and/or distortions are corrected. When exposing a second or subsequent layer (e.g., of a wafer or a substrate), prior misalignments and/or distortions are determined and known allowing corrections to be applied to the second or subsequent layer using the rasterizer for improved pattern-to-pattern or layer-to-layer matching.

In order to better understand the operation of system 300, consider a tool having an orthonormal frame of reference OXYZ, with the axes OX and OY laying in the object plane and the axis OZ normal to it. General displacement and deformation of the reflective surface of the tool's spatial light modulator (or spatial light modulator arrays or cells) can be described in terms of the following components. First, three degrees of freedom corresponding to rigid body displacement in the OXY plane and rotation around the OZ axis. These displacements leave the pattern formed by the spatial light modulator's reflective surface in the object plane. Second, three degrees of freedom corresponding to the rigid body displacement along the OZ axis and two rotations around the OX and OY axes. These degrees of freedom result in a global piston and tilt of the spatial light modulator's reflective surface. Third, an infinite (or a very large) number of degrees of freedom characterizing the arbitrary deformation of spatial light modulator's reflective surface. These degrees of freedom result in a piston and tilt that vary from pixel to pixel.

The first and second sets of degrees of freedom described above (i.e., rigid body degrees of freedom) can be measured using any position measurement technique known to persons skilled in the relevant art(s). The first set of degrees of freedom can be compensated using a rasterization algorithm, for example, during exposure or printing because they correspond to a small correction of the position of each pixel. The second set of degrees of freedom result in a change in optical modulation properties of each pixel. As a result of these degrees of freedom, each pixel acquires a certain displacement in the Z direction and also a tilt around the OX and OY axes. This results in a modification of optical modulation capabilities of each pixel. Such modification can be accounted for in a rasterization algorithm during exposure or printing, but it will require a more substantial modification of the algorithm compared to that needed to compensate for the first set of degrees of freedom.

The third set of degrees of freedom described above can be measured, for example, using position sensors on the back of the spatial light modulator (e.g., on the back of each tilting mirrors) or optical methods based on measuring the field-varying defocus. When accurately measured, their effect is a combination of the effects of the first and second sets of degrees of freedom. Each pixel will sample a slightly different portion of the pattern and the modulation capabilities of each pixel will be modified.

In embodiments of the present invention, depending on the costs and complexities involved, a variety of means such as mechanical compensation and cooling of the spatial light modulator may be used in combination to compensate for misalignments and deformations. For instance, in one embodiment, some degrees of freedom (e.g. the first set described above) are compensated for in rasterization, some degrees of freedom (e.g. the second set described above) are compensated for by mechanical actuators, and some degrees of freedom (e.g. the third set described above) are compensated for by cooling the spatial light modulator or by passively isolating the spatial light modulator from the vibrations and other undesirable mechanical displacements.

Generally speaking, except for special situations like stitching, a rasterizer according to the present invention can compute the state of each pixel of a pattern without taking into account the prior history of the spatial light modulator's misalignment and deformation. A rasterizer according to the present invention typically implements a rasterization algorithm that computes the state (e.g. a tilt or a piston or a graytone) of every pattern pixel generated by the spatial light modulator so as to optimally render a desired aerial image or dose pattern in the resist coated on a wafer or substrate. In stitching operations, the prior history may be taken into account because the area near an image edge is affected by two exposures (shots) occurring at different times. A knowledge of the misalignment and deformation during previous neighboring exposures makes accounting for edge effects easier.

Figure 4:
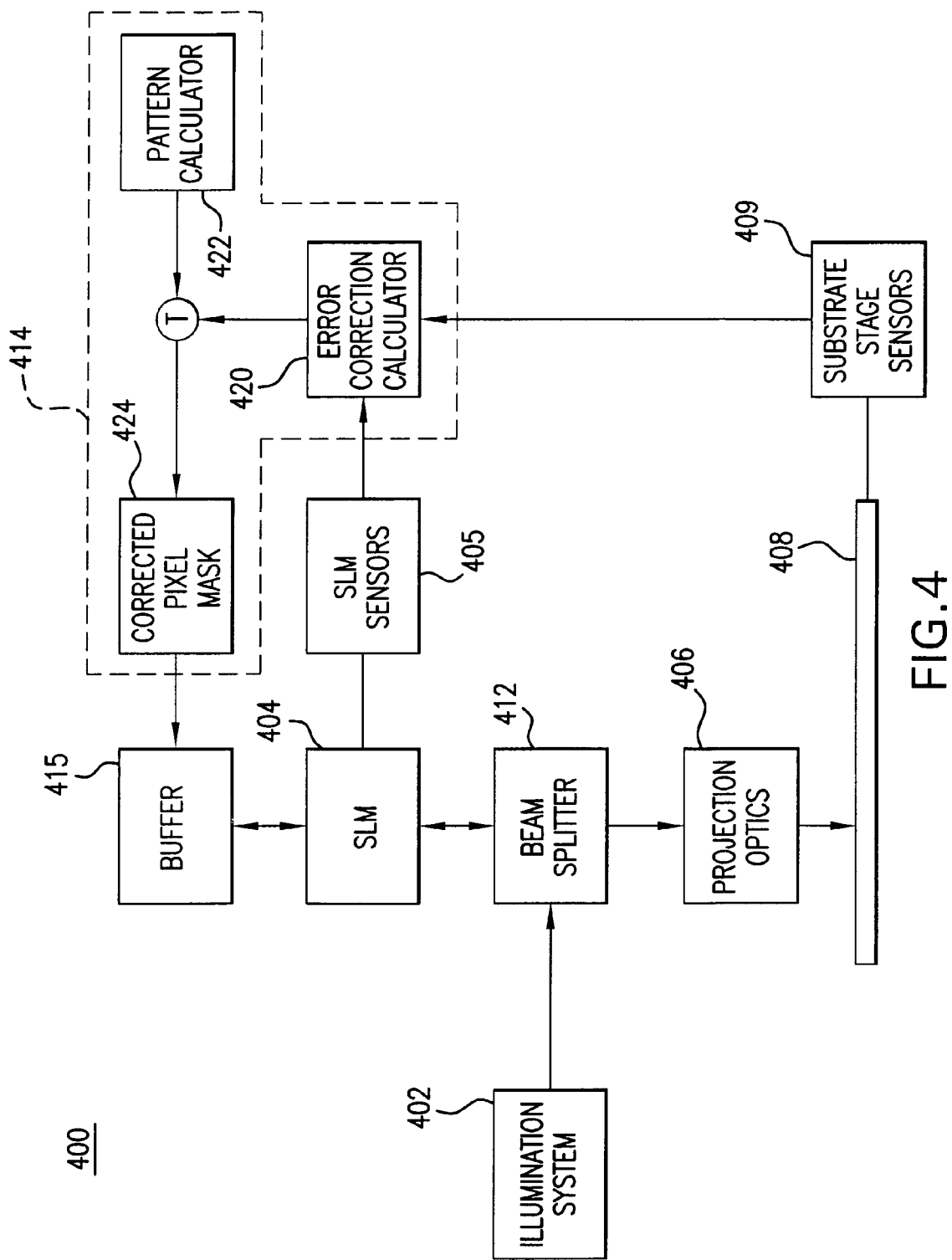
FIG. 4 is a schematic illustration of a maskless lithography system according to an embodiment of the present invention.

FIG. 4 is a schematic illustration of a maskless lithography system 400 according to an embodiment of the present invention. Maskless lithography system 400 includes an illumination system 402, a spatial light modulator 404, spatial light modulator sensors 405, projection optics 406, a substrate stage 408, substrate stage sensors 409, a beam splitter 412, a rasterizer 414, and an buffer 415 coupled together as shown in FIG. 4.

In an embodiment, illumination energy emitted by illumination source 402 is directed to spatial light modulator 404 using a beam-splitter 412. In one embodiment, illumination source 402 is a pulsed excimer laser. A continuous illumination source also can be employed. Illumination energy incident upon spatial light modulator 404 is reflected or conditioned in accordance with pattern data stored in buffer 415 to form patterns or pattern images. The patterns formed by spatial light modulator 404 are projected or imaged onto a plane proximate to substrate stage 408 by projection optics 406.

Spatial light modulator sensors 405 and substrate stage sensors 409 measure aspects of maskless lithography system 400 related to misalignment and/or deformation of spatial light modulator 404 and the pattern formed by spatial light modulator 404. Sensors 405 and 409 can include any sensors known to persons skilled in the relevant art(s) such as capacitance gauges or other position sensors. Sensors 409 also can include sensors that produce outputs relating to aerial images or field-varying defocus. The outputs of sensors 405 and 409 are provided to rasterizer 414 (error correction calculator 420).

Rasterizer 414 implements a rasterization algorithm that calculates the pattern data stored in buffer 415 and applied to spatial light modulator 404 to form patterns. As shown in FIG. 4, rasterizer 414 includes an error correction calculator 420 and a pattern calculator 422 that together form a corrected pixel mask 424 (i.e., pattern data). Error correction calculator 422 generates misalignment/deformation compensation data, based on input signal(s) received from sensors 405 and/or 409, used to adjust the pixel data generated by pattern calculator 422.

In an embodiment, rasterizer 414 generates the pattern data during printing or substrate exposure (i.e., rasterizer 414 operates in real time, computing the state of each pixel of the patterns on the fly). In another embodiment, rasterizer 414 retrieves pre-computed data from a memory or storage media.

Figure 5:
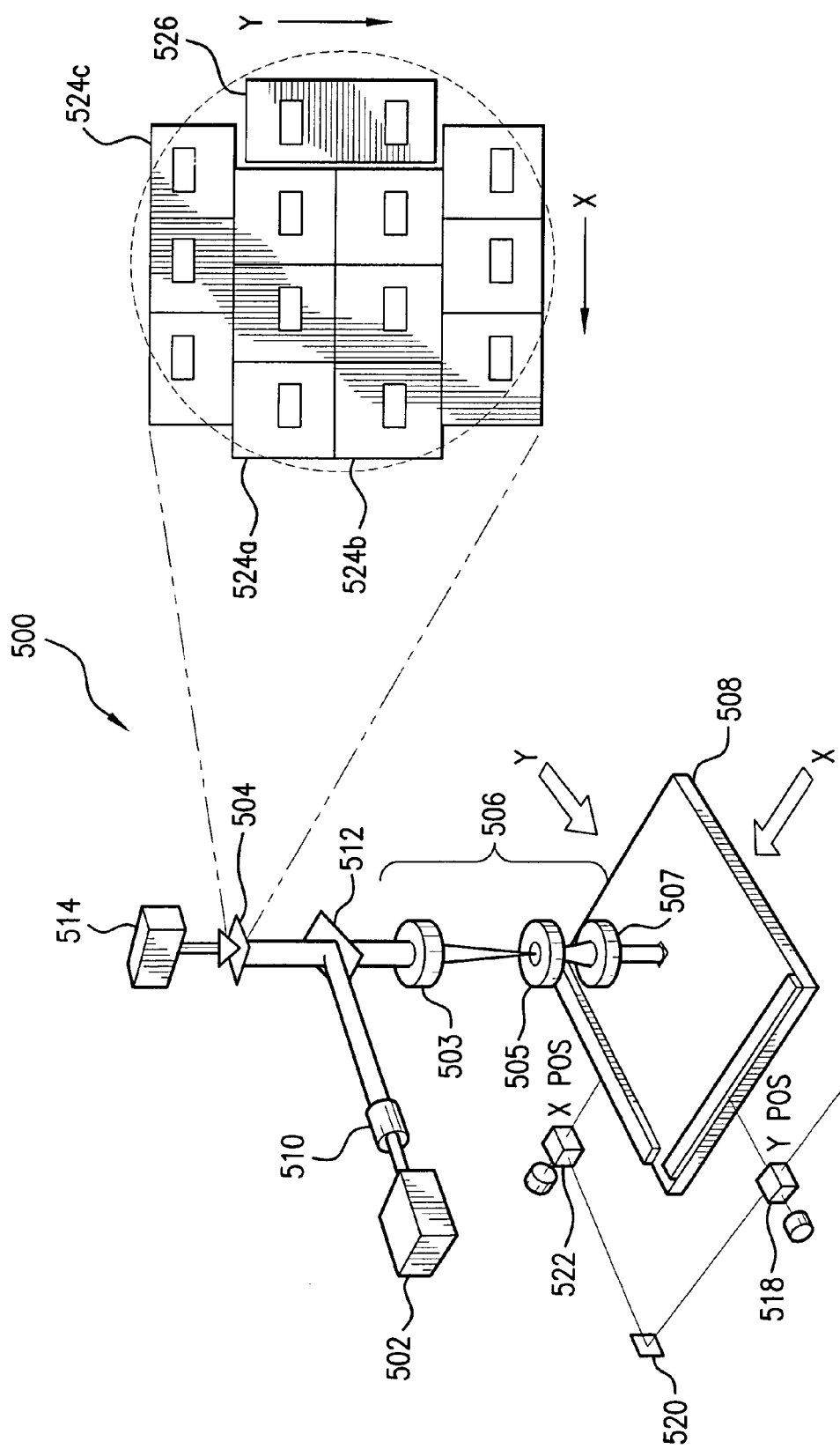
FIG. 5 is a more detailed schematic illustration of a maskless lithography system according to an embodiment of the present invention.

FIG. 5 is a more detailed schematic illustration of a maskless lithography system 500 according to an embodiment of the present invention. System 500 includes an illumination source 502, a spatial light modulator 504, projection optics 506, and a substrate stage 508.

In an embodiment, illumination energy emitted by illumination source 502 is conditioned by illumination optics 510. Illumination energy exiting illumination optics 510 is directed to spatial light modulator 504 using a beam-splitter 512. In an embodiment, illumination source 502 is a pulsed excimer laser. A continuous illumination source can be employed.

As illustrated in FIG. 5, spatial light modulator 504 is a reflective type spatial light modulator that includes a plurality of spatial light modulator arrays or cells 524 and a reference reticle 526, as shown in the blown-up portion of the figure. In the embodiment shown in FIG. 5, spatial light modulator 504 has twelve spatial light modulator cells 524. Other embodiments can have greater or fewer than twelve spatial light modulator cells 524. Reference reticle 526 includes fixed reference features that can be used to tune and calibrate tool 500 as well as detect and compensate for misalignment and/or deformation of spatial light modulator 504. As shown in FIG. 5, reference reticle 526 is located in a plane with and proximate to at least one of the spatial light modulator cells 524. Embodiments of the present invention can have more than one reference reticle 526.

In embodiments, illumination energy from illumination source 502 can illuminate spatial light modulator cells 524 and reference reticle 526 either individually or simultaneously. To illuminate all of the cells and the reference reticle simultaneously, the illumination beam can be fractured into an appropriate number of smaller beams. An optional shutter (not shown) optically located between illumination source 502 (or one of the fractured beams) and reference reticle 526 can be used to control the amount of illumination energy incident upon reference reticle 526 from the illumination source 502.

A rasterizer 514 coupled to spatial light modulator 504 applies a signal to each of the spatial light modulator cells 524 to form a pattern. In an embodiment, the signal is a stream of digital or analog data. When applied to spatial light modulator 504, the signal produces a linearized pattern bitmap. A signal applied to spatial light modulator cells 524 is used to generate a bitmap or pattern of the fixed reference features of reference reticle 524.

Illumination energy reflected from spatial light modulator 504 passes through beam-splitter 512 and enters projection optics 506. As shown in FIG. 5, in one embodiment, projection optics 506 includes a lens or lens group 503, an aperture 505, and a lens or lens group 507. A pattern image is formed using reflected illumination energy from spatial light modulator cells 524 that enters a pupil of projection optics 506. A reference image is formed using reflected illumination energy from reference reticle 526 that enters the pupil of projection optics 506.

Substrate stage 508 is moveable in the X and Y directions to permit step and scan lithography. The Y-direction position is controlled using motors (not shown) and interferometer 518. The X-direction position is controlled using motors (not shown) and interferometer 522. A laser 516 and a beam-splitter 520 are used to provide illumination to interferometer 518 and interferometer 522. The images formed by projection optics 506 can be located at different areas of substrate stage 508 by changing the position of substrate stage 508.

An image scanner (see FIG. 8) is used to detect the pattern image and the reference image. In an embodiment, the image scanner is a photosensitive device that produces an electronic signal proportional to the intensity of the image being scanned. In other embodiments, the pattern image and the reference image are three-dimensional aerial images.

A comparator (see FIG. 8) coupled to the image scanner compares the pattern image to the reference image to detect misalignments and deformations. In one embodiment, the comparator generates image quality metrics that are known in the relevant art and compares these metrics using conventional comparison techniques. In an embodiment, an adjustment control coupled to the comparator automatically adjusts the tool based on an output of the comparator. In embodiments, the tool may be adjusted by adjusting the illumination source, the spatial light modulator, the projection optics, and/or the substrate stage in addition to using the rasterizer to compensate for misalignment and deformation. Such periodic adjustments to the tool can be made, for example, at least once during the processing of each lot of substrates.

In an embodiment of the present invention, a spatial light modulator is used that controls the transmission or passage of illumination energy rather than the reflection of illumination energy. In this embodiment, the illumination optics are rearranged to appropriately illuminate the spatial light modulator.

Additional details regarding maskless lithography system 500 are included in U.S. patent application Ser. No. 10/812, 977, filed Mar. 31, 2004, which is incorporated herein by reference in its entirety.

Figure 6:
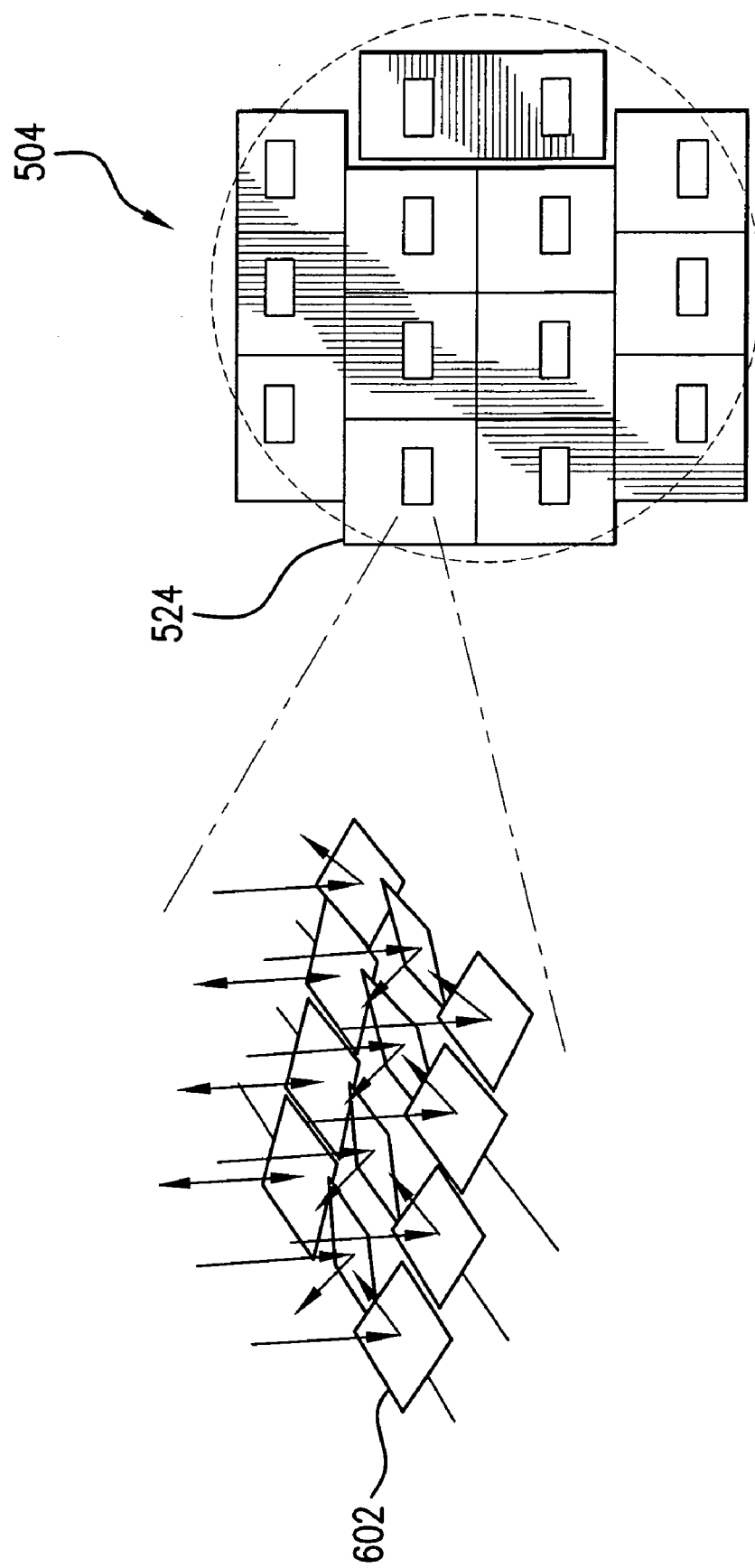
FIG. 6 is a schematic illustration of a spatial light modulator according to an embodiment of the present invention.

FIG. 6 is a schematic illustration of a spatial light modulator according to an embodiment of the present invention. As shown in FIG. 6, each spatial light modulator cell 524 includes a plurality of pixel modulators 602. In an embodiment, a pixel modulator 602 reflects illumination energy either parallel to an incident illumination ray or at some angle to the incident illumination ray. In an embodiment, an on-pixel is one that reflects illumination energy parallel to an incident illumination ray.

Figure 7:
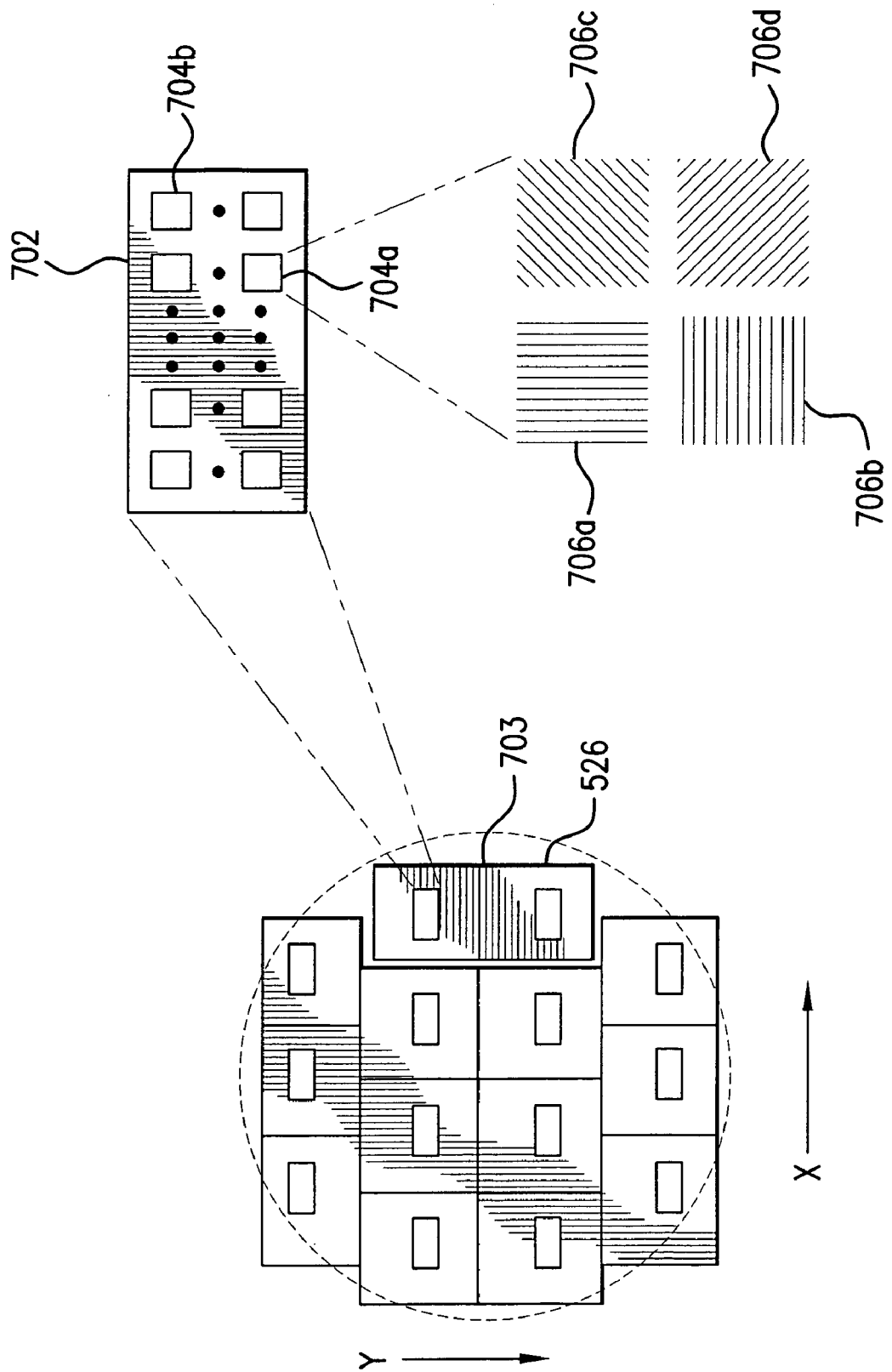
FIG. 7 is a schematic illustration of a reference reticle according to an embodiment of the present invention.

FIG. 7 is a schematic illustration of a reference reticle according to an embodiment of the present invention. As shown in FIG. 7, reference reticle 526 has two major regions 702 on a single plate 703. In embodiments, plate 703 can be tilted to direct incident illumination energy away from the pupil of projection optics 506. Each major region 702 includes a plurality of sub-regions 704 having reference features 706. In the exemplary embodiment of FIG. 7, sub-region 702a has four reference features 706a, 706b, 706c, and 706d. Feature 706a is a series of parallel lines running in the Y-direction. Feature 706b is a series of parallel lines running in the X-direction. Feature 706c is a series of parallel lines running at a 45 degree diagonal to the Y-direction. Feature 706d is a series of lines running perpendicular to the lines of feature 706c. As would be known to persons skilled in the relevant art(s), these four line orientations are useful for setting up and calibrating a lithography tool. Additional lines having different orientations can be included in other sub-regions 704, for example, to evaluate stitching operations. In an embodiment, the features of reference reticle 526 are formed using clear openings in a chrome mask. However, any known means can be used to form the features of a reference reticle, including a grating.

Figure 8:
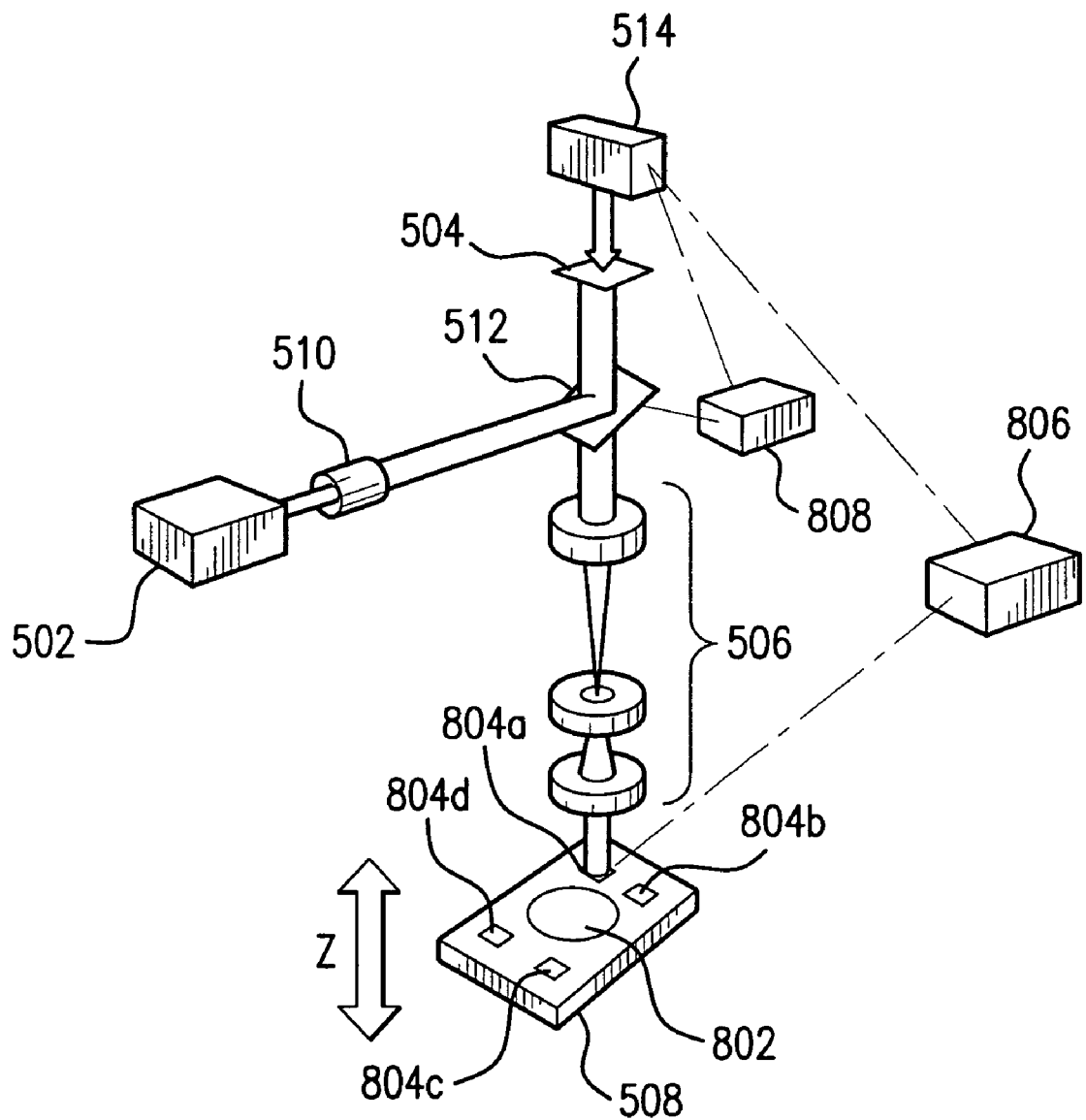
FIG. 8 is a schematic illustration of how to obtain an aerial image according to an embodiment of the present invention.

FIG. 8 is a schematic illustration of how to obtain, for example, an aerial image or field-varying defocus information according to an embodiment of the present invention. As described above with reference to FIG. 5, illumination energy is emitted by illumination source 502 and conditioned by illumination optics 510. The illumination energy is directed to spatial light modulator 504 with beam-splitter 512. A signal is applied to spatial light modulator 504 to form a pattern of reference features contained on the reference reticle of spatial light modulator 504. Projection optics 506 form a pattern image with light reflected off the spatial light modulator cells of spatial light modulator 504 and a reference image with light reflected off the reference reticle of spatial light modulator 504. The pattern image and the reference image are detected using an image scanner 804. In embodiments, image scanners 804 are installed at and can capture images at one or more locations 804a, 804b, 804c, and 804d. The locations are preferably proximate to the edge of a substrate 802. Movement of the substrate stage 508 in the Z-direction allows image scanner(s) 904 to capture a three-dimensional image or field-varying defocus information.

As would be known to persons skilled in the relevant art(s) given the description herein, by capturing and comparing aerial images, for example, of the pattern image and the reference image, both misalignment and deformation of the spatial light modulator cells can be detected. An example sensor/comparator 806 is shown in FIG. 8, which provides an input signal to rasterizer 514 based on a comparison of the pattern image and the reference image. How to implement sensor/comparator 806 will be understood by persons skilled in the relevant art(s) given the description herein.

Figure 9:
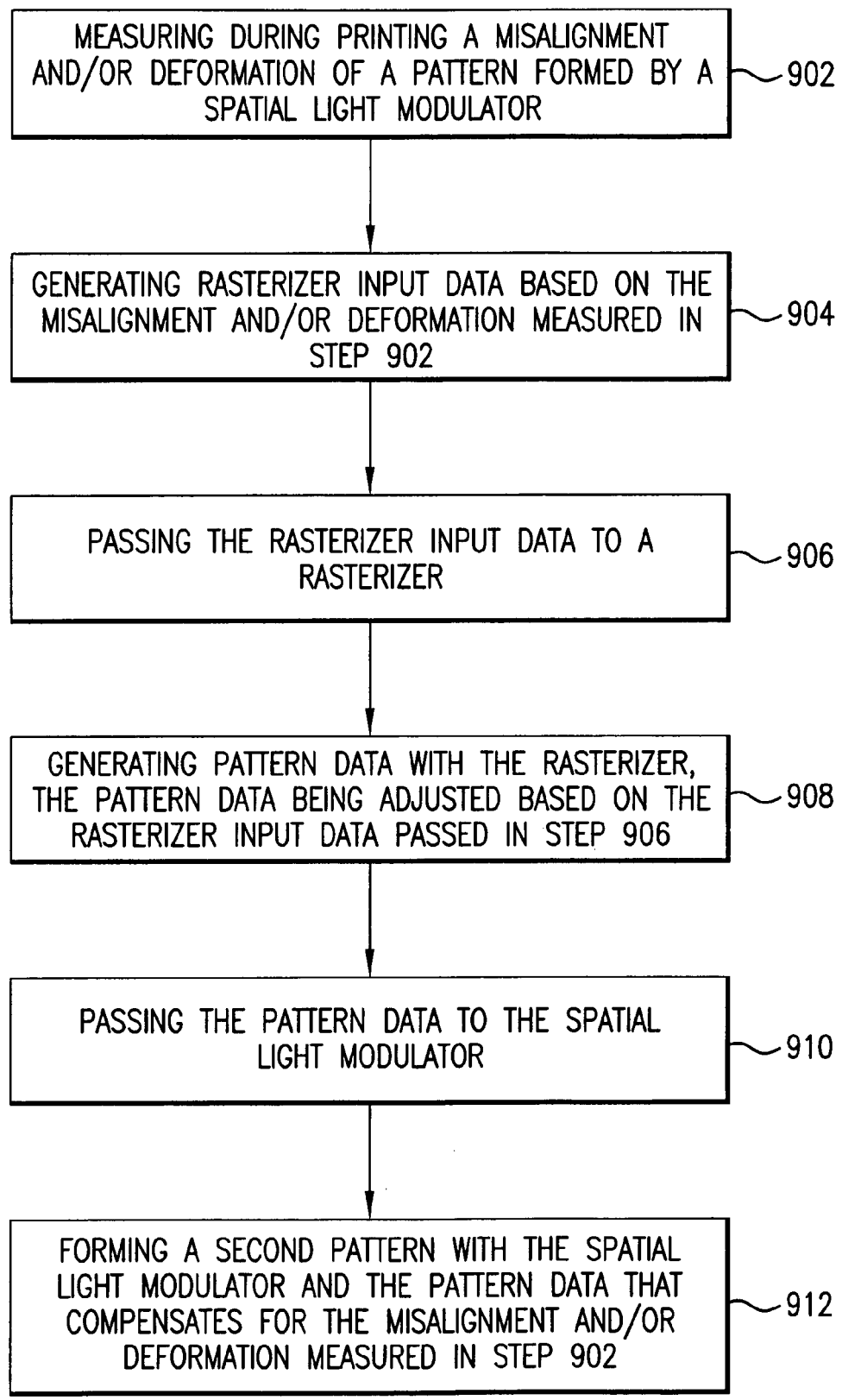
FIG. 9 is a flowchart of a method for compensating for static and/or dynamic misalignments and deformations in a maskless lithography system according to an embodiment of the present invention.

FIG. 9 is a flowchart of a method 900 for compensating for static and/or dynamic misalignments and deformations in a maskless lithography system according to an embodiment of the present invention. Method 900 includes steps 902, 904, 906, 908, 910, and 912.

In step 902, a misalignment and/or deformation of a pattern formed by a spatial light modulator is measured during printing. The misalignment and/or deformation can be measured directly, for example, using an aerial image scanner or indirectly, for example, using one or more positional sensors that determine the position(s) of various part(s) of a lithography tool and infer the presence of a misalignment and/or deformation.

In step 904, rasterizer input data based on the misalignment and/or deformation measured in step 902 is generated. The rasterizer input data can be a direct output of a sensor used to measure a misalignment and/or deformation, or it can be calculated data derived from the output of a sensor used to measure a misalignment and/or deformation.

In step 906, the rasterizer input data is passed to a rasterizer. The data can be passed in either digital or analog form.

In step 908, pattern data is generated with the rasterizer or rasterizer algorithm. In an embodiment, the pattern data includes state information (e.g. a tilt or a piston or a graytone) for every pattern pixel to be generated by a spatial light modulator of a lithography tool. The pattern data is adjusted, based on the rasterizer input data passed in step 906, to compensate for misalignment and/or deformation of lithography tool parts such as, for example, the tool's spatial light modulator arrays or cells and the substrate stage.

In step 910, the pattern data is passed to the spatial light modulator. As in step 906, the data can be passed in either digital or analog form.

In step 912, a second pattern is formed with the spatial light modulator and the pattern data generated in step 908. The second pattern compensates for the misalignment and/or deformation measured in step 902.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system for maskless lithographic printing, comprising:
    a spatial light modulator that forms patterns, the spatial light modulator including a plurality of spatial light modulator arrays and a reference reticle;
    a substrate stage;
    at least one optical element that images the patterns onto a substrate held by the substrate stage;
    a rasterizer, coupled to the spatial light modulator, that generates pattern data used by the spatial light modulator to form the patterns; and
    a sensor, coupled to the rasterizer, that provides a signal to the rasterizer related to misalignment of a first spatial light modulator array relative to a frame of reference,
    wherein the rasterizer uses the signal from the sensor in generating the pattern data to compensate for misalignment of the first spatial light modulator array relative to the frame of reference.

2. The system of claim 1, wherein the sensor is a positional sensor.

3. The system of claim 1, wherein the sensor provides a signal to the rasterizer related to a displacement of the first spatial light modulator array relative to the frame of reference.

4. The system of claim 3, wherein the displacement is within a plane of the frame of reference.

5. The system of claim 3, wherein the displacement is normal to a plane of the frame of reference.

6. The system of claim 1, wherein the sensor provides a signal to the rasterizer related to a tilting of the first spatial light modulator array relative to the frame of reference.

7. The system of claim 1 wherein the sensor provides a signal to the rasterizer related to a rotation of the first spatial light modulator array relative to the frame of reference.

8. The system of claim 1, wherein the sensor provides a signal to the rasterizer related to an aerial image of a pattern formed by the first spatial light modulator array.

9. The system of claim 1, wherein the sensor provides a signal to the rasterizer related to field-varying defocus of a pattern formed by the first spatial light modulator array.

10. The system of claim 1, wherein the sensor provides a signal to the rasterizer related to a warping of a surface of the first spatial light modulator array.

11. The system of claim 1, wherein the rasterizer compensates for static misalignment of the first spatial light modulator array relative to the frame of reference.

12. The system of claim 1, wherein the rasterizer compensates for dynamic misalignment of the first spatial light modulator array relative to the frame of reference.

13. The system of claim 1, wherein the rasterizer compensates for mechanical misalignment of the first spatial light modulator array.

14. The system of claim 1, wherein the rasterizer compensates for misalignments or imperfections caused by aberrations and distortions induced by the projection optics.

15. The system of claim 1, wherein the rasterizer calculates the pattern data during exposure of the substrate.

16. The system of claim 1, wherein the rasterizer retrieves pre-computed pattern data from a memory during exposure of the substrate.

17. A method for maskless lithographic printing with a tool including a spatial light modulator, which has a plurality of spatial light modulator arrays and a reference reticle, and a rasterizer, comprising:
  (a) comparing a first pattern formed using the reference reticle to a second pattern formed using a first spatial light modulator array to determine a misalignment of the first spatial light modulator array relative to a frame of reference;
  (b) generating rasterizer input data based on the misalignment determined in step (a);
  (c) providing the rasterizer input data to the rasterizer;
  (d) generating pattern data with the rasterizer, the pattern data being adjusted based on the rasterizer input data provided in step (c);
  (e) providing the pattern data to the spatial light modulator; and
  (f) forming a third pattern with the spatial light modulator and the pattern data that compensates for the misalignment measured in step (a).

18. The method of claim 17, wherein step (a) comprises determining a displacement misalignment of the first spatial light modulator array relative to the frame of reference.

19. The method of claim 18, wherein the displacement is within a plane of the frame of reference.

20. The method of claim 18, wherein the displacement is normal to a plane of the frame of reference.

21. The method of claim 17, wherein step (a) comprises determining a tilting misalignment of the first spatial light modulator array relative to the frame of reference.

22. The method of claim 17, wherein step (a) comprises determining a rotational misalignment of the first spatial light modulator array relative to the frame of reference.

23. The method of claim 17, wherein step (a) comprises determining field-varying defocus of a pattern formed by the first spatial light modulator array.

24. The method of claim 17, wherein step (d) comprises generating pattern data that compensates for static misalignment of the first spatial light modulator array.

25. The method of claim 17, wherein step (d) comprises generating pattern data that compensates for dynamic misalignment of the first spatial light modulator array.

26. The method of claim 17, wherein step (d) comprises generating pattern data that compensates for misalignment caused by aberrations and distortions induced by the projection optics.

27. The method of claim 17, wherein step (d) comprises calculating the pattern data.

28. The method of claim 17, wherein step (d) comprises retrieving pre-computed pattern data from a memory.

29. The method of claim 17, wherein
  step (a) further comprises determining a warping of a surface of the first spatial light modulator array;
  step (b) further comprises generating rasterizer input data based on the warping measured in step (a); and
  step (f) further comprises forming the third pattern with the spatial light modulator and the pattern data that compensates for the warping measured in step (a).

* * * * *